(12) United States Patent
Shearman et al.

(10) Patent No.: US 6,512,679 B1
(45) Date of Patent: Jan. 28, 2003

(54) VARIABLE INSERTION FORCE CIRCUIT PACK LATCHING SYSTEM

(75) Inventors: Simon Shearman, Almonte (CA); Richard J. Glover, Stittsville (CA); Youssef Nakhoul, Quebec (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/985,236

(22) Filed: Nov. 2, 2001

(51) Int. Cl.[7] .................................................. H05K 5/00
(52) U.S. Cl. ........................ 361/759; 361/801; 361/769
(58) Field of Search ................................. 361/759, 769, 361/684, 685, 754, 798, 801; 439/327, 160, 157, 325; 211/26, 89.01, 41.17; 70/208

(56) References Cited

U.S. PATENT DOCUMENTS

| | | | |
|---|---|---|---|
| 5,414,594 A | * | 5/1995 | Hristake ..................... 361/754 |
| 5,575,529 A | | 11/1996 | Dowdy et al. |
| 5,868,261 A | | 2/1999 | Collins et al. |
| 6,050,115 A | * | 4/2000 | Schroter et al. ............. 292/268 |
| 6,074,353 A | * | 7/2000 | Koerber et al. ............. 361/754 |
| 6,267,614 B1 | * | 7/2001 | Good et al. .................. 439/160 |

* cited by examiner

Primary Examiner—David Martin
Assistant Examiner—Thanh S. Phan

(57) ABSTRACT

The present invention relates to a variable insertion force circuit pack latching system comprising a latch assembly mounted on the front of a circuit pack and adapted to couple to a trough block mounted on a bay frame. The trough block has a hook-shaped tongue adapted to conversely couple to the latch assembly to secure the circuit pack in the installed position.

4 Claims, 5 Drawing Sheets

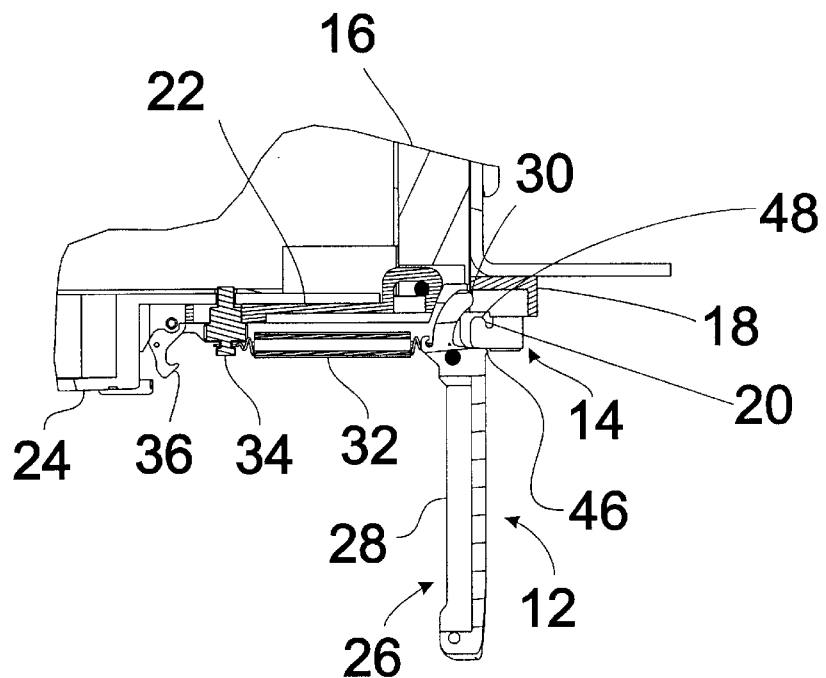
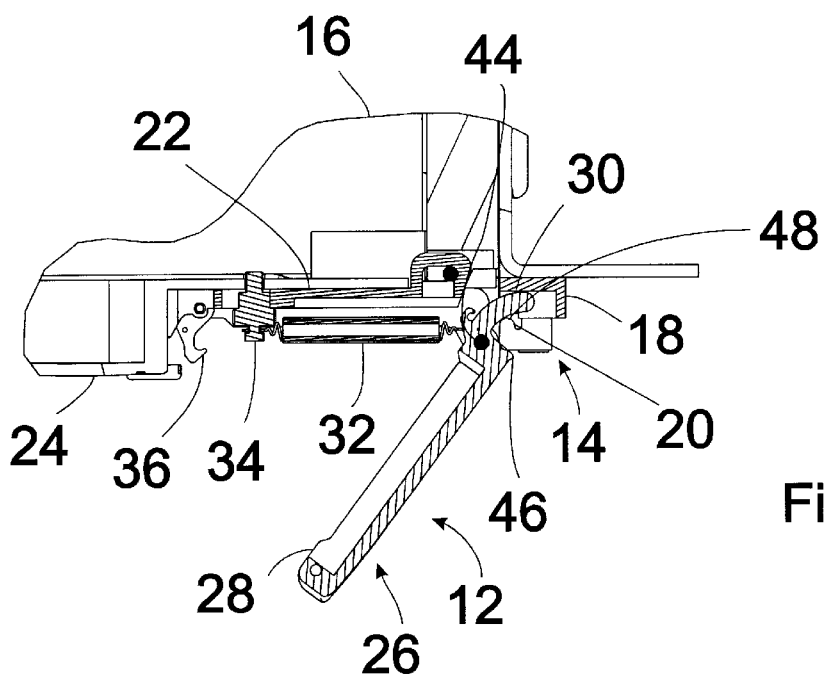

VARIABLE INSERTION FORCE CIRCUIT PACK LATCHING SYSTEM

FIELD OF THE INVENTION

The present invention is directed to telecommunications bay maintenance and more particularly to a circuit pack latching system.

BACKGROUND OF THE INVENTION

The maintenance of telecommunications bays requires the periodic extraction and insertion of major components called circuit packs. At the backplane end of a circuit pack are thousands of connector pins surrounded by an electromagnetic compatibility (EMC) gasket.

When inserting a circuit pack into its bay, these connector pins engage their respective pin holes requiring an increase in insertion force to overcome the opposing force as the pins encounter their pin hole walls.

As advances have been achieved in circuit pack technologies there has been a resultant increase in pin density, and as pin densities increase the required insertion force increases correspondingly. One way to overcome these increases is to have the installer apply more manual force. However, a preferred solution would be to provide an increase in insertion force without requiring an increase in applied manual force.

One way to provide increased insertion force without requiring increased manual force is to provide a levered latch that has a longer arm for increased leverage. However, because latches are typically located on circuit pack faceplates, a longer arm would present difficulties since circuit packs have limited faceplate real estate, most of which is required for optical interconnects and LEDs. As well, longer arms would stick further out into aisle space when open, presenting a safety hazard and an increased risk of latch damage.

In addition to the force required to insert the pins, an additional force is required to compress the EMC gasket. The gasket maintains an EMC seal between the circuit pack and the backplane when the circuit pack is installed. In order to maintain a proper EMC seal the gasket is compressed in the last few millimeters of circuit pack insertion and its opposing force is compounded with the opposing pin force as the backplane end of the circuit pack approaches the backplane.

As well, the force required to compress an EMC gasket increases the more it has been compressed, wherein more and more force must be applied as the circuit pack approaches the backplane.

Another characteristic of EMC gaskets to be considered is known as "force relaxation", which occurs as the gasket shrinks over time, potentially leading to the loss of a proper EMC seal. In order to compensate for it, force relaxation should be taken into consideration.

Therefore, with the cumulative effect of higher and higher pin densities, compounding resistance forces and force relaxation, what is needed is a latch that provides for an intensifying insertion force without requiring a corresponding increase in applied manual force, does not take up large amounts of faceplate real estate and continues to provide available insertion force to take up tolerance that may occur due to force relaxation.

For the foregoing reasons, there is a need for an improved method of latching circuit packs.

SUMMARY OF THE INVENTION

The present invention is directed to a variable insertion force circuit pack latching system and method. The system includes a latch assembly mounted on the front of a circuit pack and adapted to couple to a trough block mounted on a bay frame, the trough block having a hook-shaped tongue adapted to conversely couple to the latch assembly to secure the circuit pack in the installed position.

The latch assembly includes a base mounted on the circuit pack front using a base fastener fastened through a traversing channel formed within the base, and the base adapted to slide laterally across the circuit pack front. The latch assembly further includes a lever having a long arm and a short arm, the lever hinged-mounted to the base at about the joint of the two arms, the lever having a surface that interacts with the trough block to cause the short arm to couple with the trough block.

The latch assembly further includes a retraction spring attached at one end to the circuit pack side of the short arm of the lever towards the lever pivot point end of the short arm, and at the other end to the base fastener so that, as the latch assembly slides past the trough block during circuit pack insertion, the spring holds the latch assembly retracted within the plane of the circuit pack front until the latch assembly is activated and begins coupling with the trough block. The latch assembly further includes a catch affixed to the long arm end of the base and adapted to secure the long arm to the base once the pin connectors are fully engaged and the gasket is compressed.

In an aspect of the invention, the trough block is mounted to the bay frame using one or more fasteners and includes a spring element that provides a spring force between the hook-shaped tongue of the trough block and the bay frame about equal to the force required to insert the circuit pack. In this way, the spring element has an ability to compress to take up tolerance between the circuit pack and the backplane that may occur due to force relaxation in the gasket or the bottoming-out of the backplane connectors.

The invention provides a gain in mechanical advantage as opposing forces compound during the final phase of circuit pack engagement.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

These and other features, aspects, and advantages of the present invention will become better understood with regard to the following description, appended claims, and accompanying drawings where:

FIG. 4 is a top view showing a surface on the lever interacting with the trough block to cause the short arm to couple with the trough block;

FIG. 5 is a top view of the latch assembly being pulled out from the front of the circuit pack;

DETAILED DESCRIPTION OF THE PREFERRED EMBODIMENT

Figure 1A:
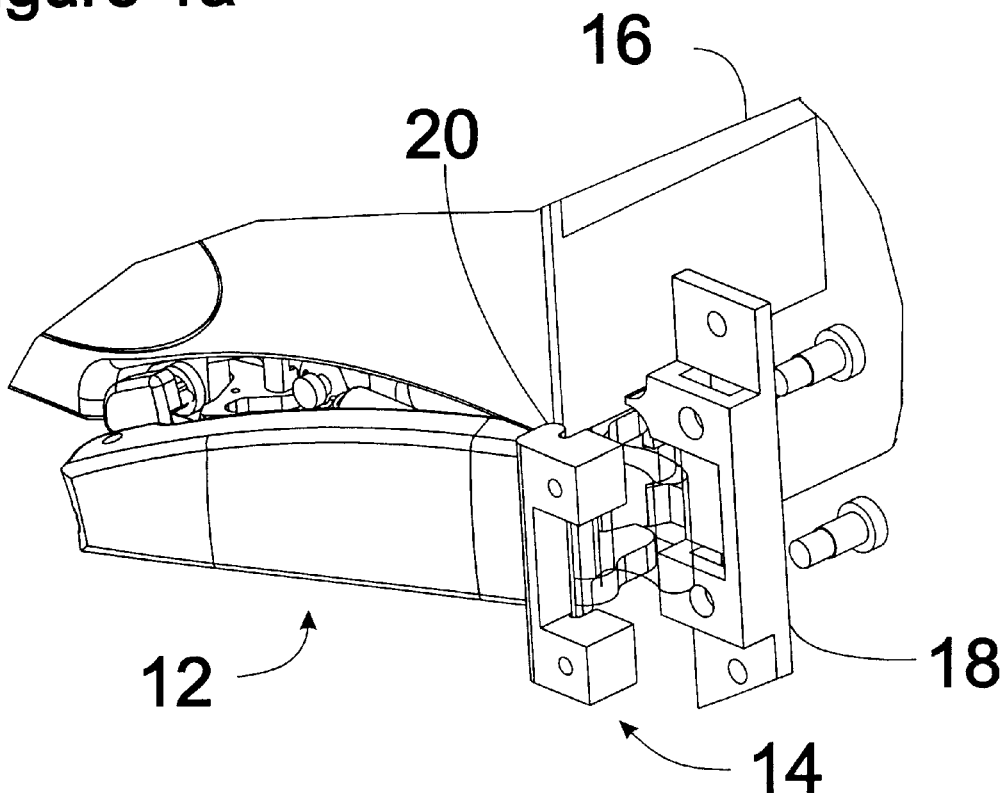
FIG. 1a is a perspective overview of a variable insertion force circuit pack latching system according to the present invention.
Figure 1B:
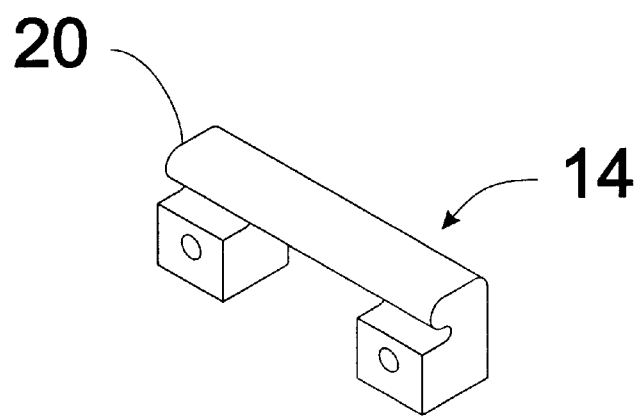
FIG. 1b is a perspective view of the trough block.

As shown in FIGS. 1a and 1b, the present invention is directed to a variable insertion force circuit pack latching system. The system comprises a latch assembly 12 mounted on the front of a circuit pack 16 and adapted to couple to a trough block 14 mounted on a bay frame 18, the trough block 14 having a hook-shaped tongue 20 adapted to conversely couple to the latch assembly 12 to secure the circuit pack 16 in an installed position within the bay.

Figure 2:
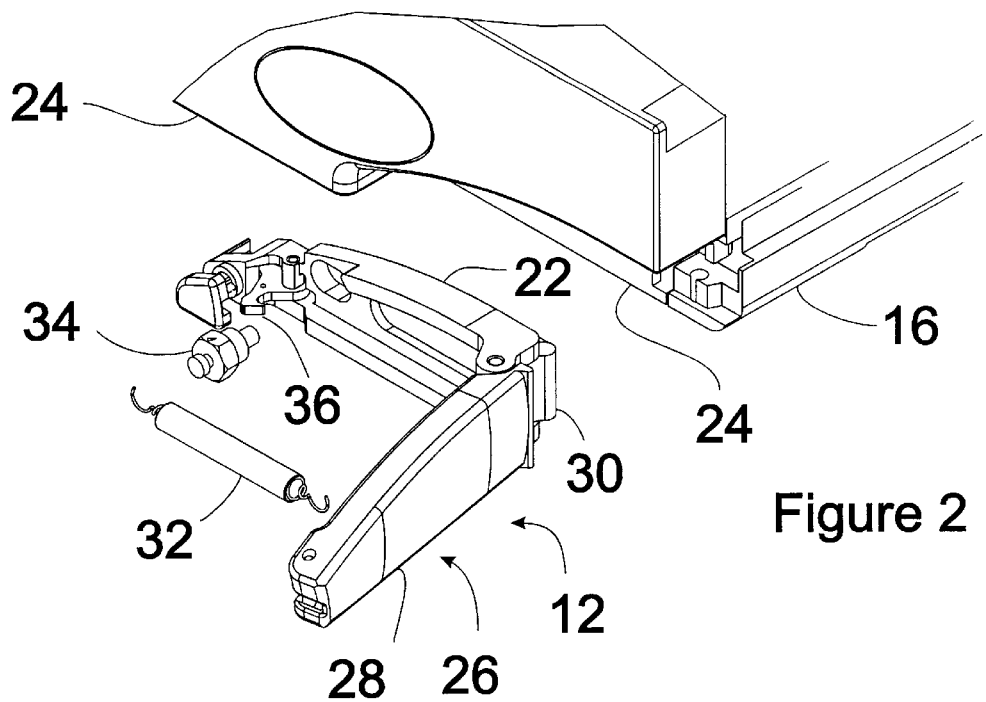
FIG. 2 is an exploded perspective view of the latch assembly.

As shown in FIG. 2, the latch assembly 12 includes a base 22 mounted on the circuit pack front 24, a lever 26 having a long arm 28 and a short arm 30 hinge-mounted on the base 22, and a retraction spring 32 attached at one end to the lever 26 and at the other end to a base fastener 34 used to fasten the base 22 on the circuit pack front 24. The latch assembly 12 further includes a catch 36 affixed to the base 22 to hold the lever's long arm 28 secured to the base 22 while the circuit pack 16 remains installed in the bay.

Figure 3:
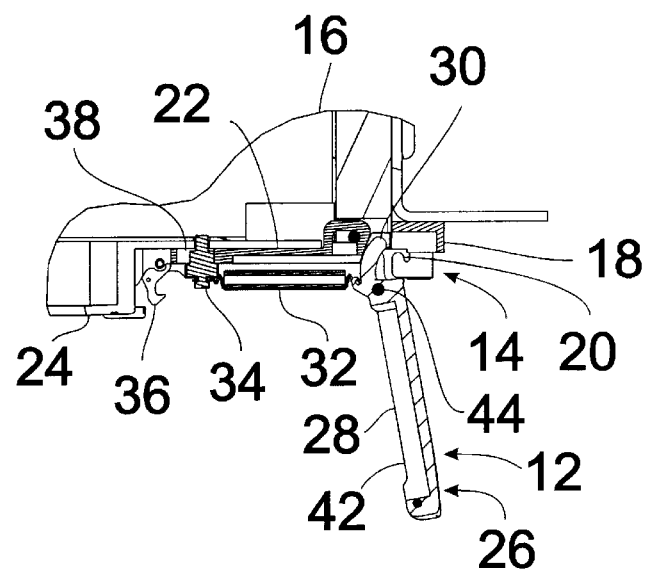
FIG. 3 is a top view showing the base being adapted to slide laterally across the circuit pack front.

As shown in FIG. 3, the base 22 is adapted to slide laterally across the circuit pack front 24 by mounting it on the front 24 of the circuit pack 16 using the base fastener 34 fastened through a traversing channel 38 formed within the base 22. The lever 26 is hinged-mounted to the base 22 at about the joint of the lever's 26 two arms 28 and 30 forming a lever pivot point 44.

The retraction spring 32 is attached at one end to the circuit pack 16 side of the short arm 30 of the lever 42 towards the lever pivot point 44 end of the short arm 30 and at the other end to the base fastener 34 so that, as the latch assembly 12 slides past the trough block 14 during circuit pack 16 insertion, the spring 32 holds the latch assembly 12 in a fully opened position retracted within the plane of the circuit pack front 24 until the short arm 30 has cleared the tongue 20.

The catch 36 is affixed to the long arm 28 end of the base 22 and adapted to secure the long arm 28 to the base 22 once the circuit pack 16 pin connectors are fully engaged and the electromagnetic compatibility (EMC) gasket is compressed. Several types of catches can be used, however the catch should move with the latch assembly 12 to maintain correct positioning relative to the moving pivot point 44.

As shown in FIG. 4, as the user pushes the circuit pack 16 deeper into the bay, a surface 46 on the lever 26 interacts on contact with the trough block 14 to cause the short arm 30 to couple with the trough block 14 at about the point when the circuit pack pins are about to engage their pin holes. As shown in FIG. 5, the hooked-shaped short arm 30 slides around the curved backplane side 48 of the hook-shaped trough block tongue 20, inducing a force vector that pulls the latch assembly 12 out from the front of the circuit pack 24 and towards the trough block 14.

Figure 6:
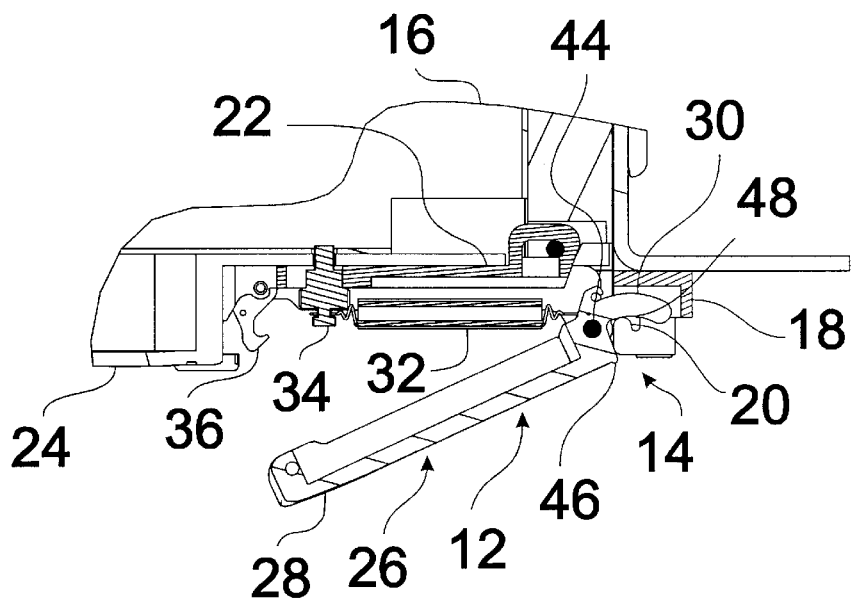
FIG. 6 is a top view showing the shortening of the working portion of the short arm.

As shown in FIG. 6, this moves the lever's pivot point 44 closer to the point where the short arm 30 contacts the tongue 20, shortening the working portion of the short arm 30 to variably increase the mechanical advantage of the long arm 28 in the final phase of latching since the length of the long arm 28 remains constant.

Figure 7A:
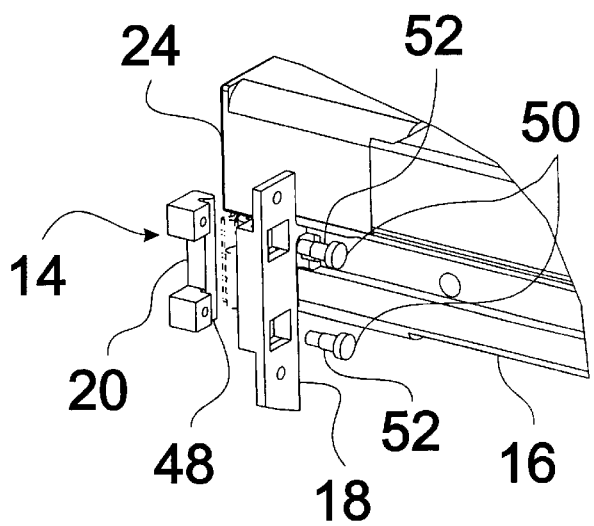
FIG. 7a is an exploded perspective view of the trough block mounted to the bay frame.
Figure 7B:
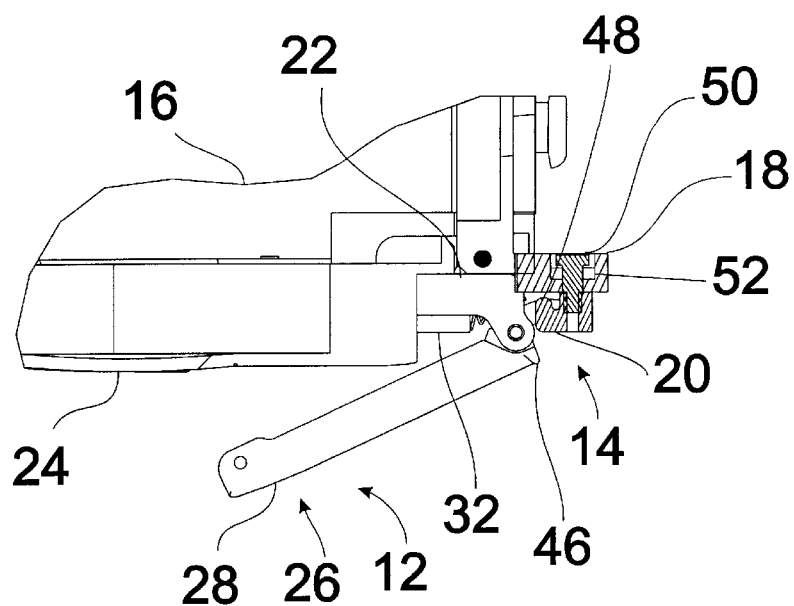
FIG. 7b is a top view of the trough block mounted to the bay frame.

As shown in FIGS. 7a and 7b, in a preferred alternative embodiment of the present invention, the trough block 14 is mounted to the bay frame 18 using one or more fasteners 50 and includes a spring element 52 that provides a spring force between the hook-shaped tongue 20 of the trough block 14 and the bay frame 18 about equal to the force required to insert the circuit pack 16. In this way, the spring element 52 has an ability to compress to take up tolerance between the circuit pack 16 and the backplane that may occur due to force relaxation in the EMC gasket or the bottoming-out of the backplane connectors.

Figure 8:
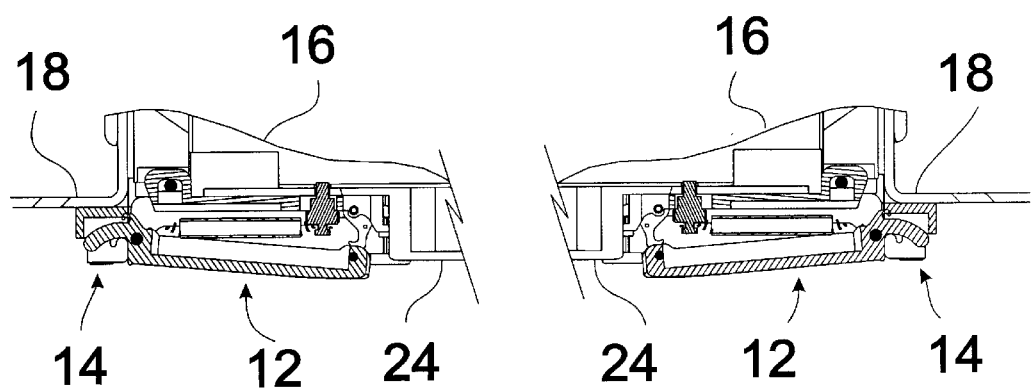
FIG. 8 is a top view showing how the system would typically be implemented in pairs.

As shown in FIG. 8, the system shown in FIGS. 1 to 6, or the preferred alternative embodiment shown in FIGS. 7a and 7b, would typically be implemented in pairs, with one system on either end of the circuit pack front 24, so that during circuit pack 16 insertion there is a balance of applied force to properly guide the circuit pack 16 into proper alignment within the bay during the final engagement of the connector pins, thereby avoiding pin damage.

The invention enables the insertion of higher-density circuit packs into higher-density backplanes and midplanes without requiring an increase in manually applied force and enables the use of shorter, more manageable levers that use lesser amounts of valuable faceplate real estate.

Circuit pack tolerances, top to bottom and left to right, must be maintained to ensure unrestricted backplane engagement. The latch assembly 12 maintains a gap between itself and the trough block 14 before they are engaged.

Although the present invention has been described in considerable detail with reference to certain preferred embodiments thereof, other versions are possible. Therefore, the spirit and scope of the appended claims should not be limited to the description of the preferred embodiments contained herein.

What is claimed is:

1. A variable insertion force latching system for a circuit pack having a front side and a rear side, the rear side having pin connectors surrounded by a gasket, the system comprising:

a latch assembly mountable on the front side of the circuit pack, the latch assembly adapted to couple to a trough block mountable on a bay frame, the trough block having a hook-shaped tongue adapted to couple to the latch assembly to secure the circuit pack in an installed position, the latch assembly including:

a base mountable on the front side of the circuit pack with a traversing channel formed in the base, the traversing channel having an elongate opening through which a base fastener may extend to slidably mount the base on the front side of the circuit pack for movement laterally across the front side of the circuit pack;

a lever having a long arm and a short arm meeting at a pivot point, the lever mounted to the base at the pivot point, the lever having surface portion that interacts with the trough block as the latch assembly is moved toward the trough block to cause the lever to pivot and to cause the short arm to engage and couple with the tongue of the trough block;

a retraction spring attached at a first end to the lever adjacent the short arm and spaced from the pivot point, the spring attachable at a second end to the base fastener thereby to apply a torque to the lever so that as the latch assembly moves toward and past the through block during circuit pack insertion, the retraction spring holds the surface portion of the lever in contact with the trough block, with continued inward motion of the circuit pack exerting a force causing the lever to rotate against the force exerted by the spring and causing the short arm to couple with the tongue; and a catch affixed a long arm end of the base, the catch adapted to secure the long arm of the lever to the base once the short arm and the tongue are fully coupled.

2. The system according to claim 1, wherein the surface portion of the lever is a shoulder that engages a complementary shoulder on the trough block to apply torque to rotate the lever around the pivot point as inward force is applied to the circuit pack.

3. The system according to claim 1, wherein the tongue of the trough block and the short arm of the lever have surfaces shaped for complementary engagement during a final stage of circuit pack insertion to enable that portion of the short arm that engages the tongue to move closer to the pivot point thereby progressively reducing the leverage of the short arm.

4. The system according to claim 1, wherein the trough block is mounted to the bay frame with a spring element that provides a spring force between the trough block tongue and the bay frame about equal to the force required to insert the circuit pack, whereby tolerance is taken up between the circuit pack and a backplane occurring due to conditions including force relaxation in the gasket and/or bottoming-out of backplane connectors.

* * * * *